(12) United States Patent
Yokota

(10) Patent No.: US 7,752,586 B2
(45) Date of Patent: Jul. 6, 2010

(54) DESIGN STRUCTURE OF AN INTEGRATION CIRCUIT AND TEST METHOD OF THE INTEGRATED CIRCUIT

(75) Inventor: Toshihiko Yokota, Kyoto-fu (JP)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 11/942,977

(22) Filed: Nov. 20, 2007

(65) Prior Publication Data

US 2009/0132973 A1    May 21, 2009

(51) Int. Cl.
   *G06F 17/50* (2006.01)
(52) U.S. Cl. ............................................. 716/8; 716/4
(58) Field of Classification Search .................. 716/4, 716/8
   See application file for complete search history.

(56) References Cited

U.S. PATENT DOCUMENTS

| | | | |
|---|---|---|---|
| 2003/0097614 A1* | 5/2003 | Rajski et al. | 714/30 |
| 2003/0115524 A1* | 6/2003 | Johnston et al. | 714/726 |
| 2004/0268181 A1* | 12/2004 | Wang et al. | 714/30 |
| 2005/0055615 A1* | 3/2005 | Agashe et al. | 714/727 |

FOREIGN PATENT DOCUMENTS

| | | |
|---|---|---|
| JP | 2000-506985 | 6/2000 |
| JP | 2000-46919 | 12/2000 |
| JP | 2005-516227 | 6/2005 |
| WO | WO 01/33237 A1 | 5/2001 |
| WO | WO2006/071426 | 4/2005 |

* cited by examiner

*Primary Examiner*—Jack Chiang
*Assistant Examiner*—Brandon W Bowers
(74) *Attorney, Agent, or Firm*—Kerry B. Goodwin; H. Daniel Schnurmann

(57) ABSTRACT

A design structure for an integrated circuit which includes: a first flip-flop which is capable of flushing and which operates by using a first clock signal CLK 1; a second flip-flop DFF 2 which operates by using a second clock signal CLK 2, and which is connected to the first flip flop; and a third flip-flop DFF 3 which operates by using the second clock signal CLK 2, and which is connected to the first flip-flop. A test on a path between the first and second flip-flops is carried out in a manner that test data is released and captured on receipt of the clock signal CLK 2 between the second flip-flop DFF 2 and the third flip-flop DFF 3 via the first flip-flop DFF 1, and that the test data is flushed by the first flip-flop DFF 1.

10 Claims, 8 Drawing Sheets

DESIGN STRUCTURE OF AN INTEGRATION CIRCUIT AND TEST METHOD OF THE INTEGRATED CIRCUIT

CROSS REFERENCE TO RELATED APPLICATIONS

This application contains subject matter that is related to co-pending U.S. patent application Ser. No. 11/555,389, filed Nov. 1, 2006.

BACKGROUND OF THE INVENTION

The present invention relates to a test of an integrated circuit such as ASIC, and particularly relates to an integrated circuit for realizing a test on a path between clock domains, and to a test method thereof. The invention further relates to a design structure upon which a design of such an integrated circuit resides.

When an application specific integrated circuit (ASIC) designed and manufactured for a particular use is manufactured, an LSSD (Level-Sensitive Scan Design) scan test (hereinafter, referred to as LSSD test) using an LSSD latch is widely carried, as a method of judging whether a chip is conforming or nonconforming.

FIG. 7 is a schematic diagram of a circuit configuration for carrying out the LSSD test.

As shown in FIG. 7, LSSD latches (flip-flops) 200 are provided respectively to the input and output sides of each of combinational circuits (circuits subject to a test) in a chip (an integrated circuit) in order to carry out the LSSD test. Furthermore, all the LSSD latches 200 in the chip are connected via a plurality of scan chains.

The LSSD latch 200 is configured by combining two D latches which are a master latch 201 and a slave latch 202. The master latch 201 includes an input of an A clock, a scan input controlled by using the A clock, an input of a C clock, and a data input controlled by using the C clock. The slave latch 202 is connected to a B clock. When the B clock is at a high level, the data of the master latch 201 is inputted to the slave latch 202.

In a normal operation, the A clock is fixed at a low level, and data is held by using the B and C clocks. On the other hand, when the LSSD test is carried out, the A and B clocks are used for inputting a test pattern (test data) and for outputting a test result.

The sequence of a static LSSD test on the circuit in FIG. 7 is as follows.

Firstly, a test pattern is set in the input side of the LSSD latch 200 via the scan chain by using the A and B clocks (hereinafter, the scan load). After the scan load is finished, the C clock is hit and an output of the combinational circuit is captured in the LSSD latch 200 on the output side. Subsequently, a value captured in the LSSD latch 200 is observed by scan-out (hereinafter, scan unload). It is possible to judge whether logic is correct or incorrect in each combinational circuit by comparing a value obtained by this scan unload with an expected value figured out previously.

Today, it has been progressing not only that an integrated circuit such as ASIC is constructed in a larger scale and with higher density, but also that the integrated circuit operates at higher speed. Especially, the manufacturing process has been becoming more complicated, and the number of steps has been increasing. Therefore, unevenness in semiconductors' speed has been becoming wide. Hence, it is necessary to check not only whether logic is correct or incorrect, but also whether a circuit operates normally at a clock frequency upon operation. Thus, it is important to carry out a test (at-speed test) of a circuit in an operating status (at speed) rather than a static test similar to the above. However, when an operating clock in the LSSD test is provided directly from a large scale integration (LSI) tester, which is an external apparatus, with the configuration shown in FIG. 7, it is difficult to carry out an operating test. This is because an operating clock provided from the LSI tester is slower than an original operating clock (an internal frequency) of an integrated circuit (a chip).

Therefore, in order to carry out the at-speed test, the test needs to be carry out by using the same operating clock as that in the actual operation of the LSI (for example, a clock generated in a PLL circuit in the LSI). However, although an at-speed test has been realized for a latch-to-latch path within a clock domain in the LSI (that is, a part of the circuits operating at the same clock), an at-speed test has not been realized for a latch-to-latch path between different clock domains (hereinafter, a cross domain path). Moreover, from the viewpoint of a data transfer rate between different kinds of interfaces, it is becoming more important nowadays to test a transfer rate between different clock domains.

As a conventional technique to carry out a test on a part of circuits spanning different clock domains, there is a test method called an AC-delay test. This is a method of testing a cross domain path by providing a release clock and a capture clock at approximately 50 MHz from a tester. Furthermore, as another conventional technique, a method and an apparatus have been proposed for carrying out a test by use of a clock for test (hereinafter, the test clock) (for example, refer to Japanese Patent Translation Publication No. 2003-513286). In the conventional technique cited in this document, the test clock is used as the capture clock, while a local clock of each domain (a clock in actual operation generated by the PLL circuit) is used as the release clock. Consequently, it is made possible to carry out the test in a state similar to the actual operation by arranging how quickly the release clock is caused to hit the capture clock.

As described above, not only the static test to check whether the logic is correct or incorrect but also the test to guarantee alternating-current (AC) operation are becoming significantly important for a today's integrated circuit in which its performance has been more improved, and in which its speed has been enhanced. In a test carried out by inputting the operation clock (test clock) from an LSI tester, since the operating clock is slow, the accuracy of the test is not improved, thereby leading to deterioration in fraction defective after shipment. Hence, there is a need to carry out the at-speed test in which a test is carried out by use of the same clock as that in the actual operation of the LSI. However, the at-speed test on the clock domain path has not been realized yet.

In the AC delay test carried out conventionally, the release-capture operation is performed by use of the B and C clocks which are operating clocks in the LSSD test shown in FIG. 7. However, there are problems that timing is not set accurately (so called timing creation), since these clocks are not used in the actual operation, and that there is a large difference in the control over a time when a clock arrives at a latch since the clock is provided from a tester channel.

In the conventional technique cited in Patent Document 1, a complicated test control circuit is provided in the LSI in order to carry out the test. Therefore, although it is possible to carry out the test in a state similar to the at-speed test, there are problems that the circuit scale of the LSI becomes large, and that timing close becomes difficult.

SUMMARY OF THE INVENTION

In a first aspect, the invention is a design structure embodied in a machine readable medium for designing, manufacturing, or testing a design. The design structure comprises an integrated circuit including a first flip-flop which is capable of flushing, and which operates by using a first clock signal. A second flip-flop which is capable of flushing is provided, which operates by using a second clock signal, and which is connected to the first flip flop. A third flip-flop is provided which operates by using the second clock signal, and which is connected to the first flip-flop. A fourth flip-flop is provided which operates by using the first clock signal, and which is connected to the second flip-flop. A test on a path between the first and the second flip-flops is carried out in a first test mode in which test data is released from the third flip-flop on receipt of the second clock signal, is flushed by the first flip-flop, and is captured in the second flip-flop. In a second test mode, test data is released from the first flip-flop on receipt of the first clock signal, is flushed by the second flip-flop, and is captured in the fourth flip-flop.

In a second aspect, the invention is a design structure embodied in a computer readable medium for performing a test method of an integrated circuit. The integrated circuit includes: a first flip-flop which is capable of flushing, and which operates by using a first clock signal; a second flip-flop which is capable of flushing, which operates by using a second clock signal, and which is connected to the first flip flop; a third flip-flop which operates by using the second clock signal, and which is connected to the first flip-flop; and a fourth flip-flop which operates by using the first clock signal, and which is connected to the second flip-flop. The design structure comprises means for releasing test data from the third flip-flop on receipt of the second clock signal, flushing the test data in the first flip-flop, and capturing the test data in the second flip-flop. The design structure further comprises means for releasing test data from the first flip-flop on receipt of the first clock signal, flushing the test data in the second flip-flop, and capturing the test data in the fourth flip-flop.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE PREFERRED EMBODIMENT

Hereinbelow, with reference to the attached drawings, detailed descriptions will be given of a preferred embodiment mode of the present invention (hereinafter, the embodiment).

Firstly, the outline will be described. In order to carry out an at-speed test of an LSI, based on a pulse outputted from a PLL circuit (a clock generating circuit) in a chip transmitting an operating clock of the integrated circuit (the chip), it is necessary to generate a release clock and a capture clock which have intervals corresponding to the internal frequency of the chip. However, when a test is performed on a cross domain path spanning different clock domains, flip-flops at both ends of this cross domain path operates respectively in accordance with clocks generated in different PLL circuits. Hence, it is extremely difficult to control intervals of the release and capture clocks.

Therefore, the present invention realizes the at-speed test of the cross domain path on the basis of the following points.

(1) It is assumed that a path between domains is "a path within a domain" upon test.

(2) Release and capture clocks of this path are generated in one PLL upon test.

(3) A multiplexer is not inserted to achieve (1) and (2). In other words, the gating of a clock line is not performed.

Figure 1:
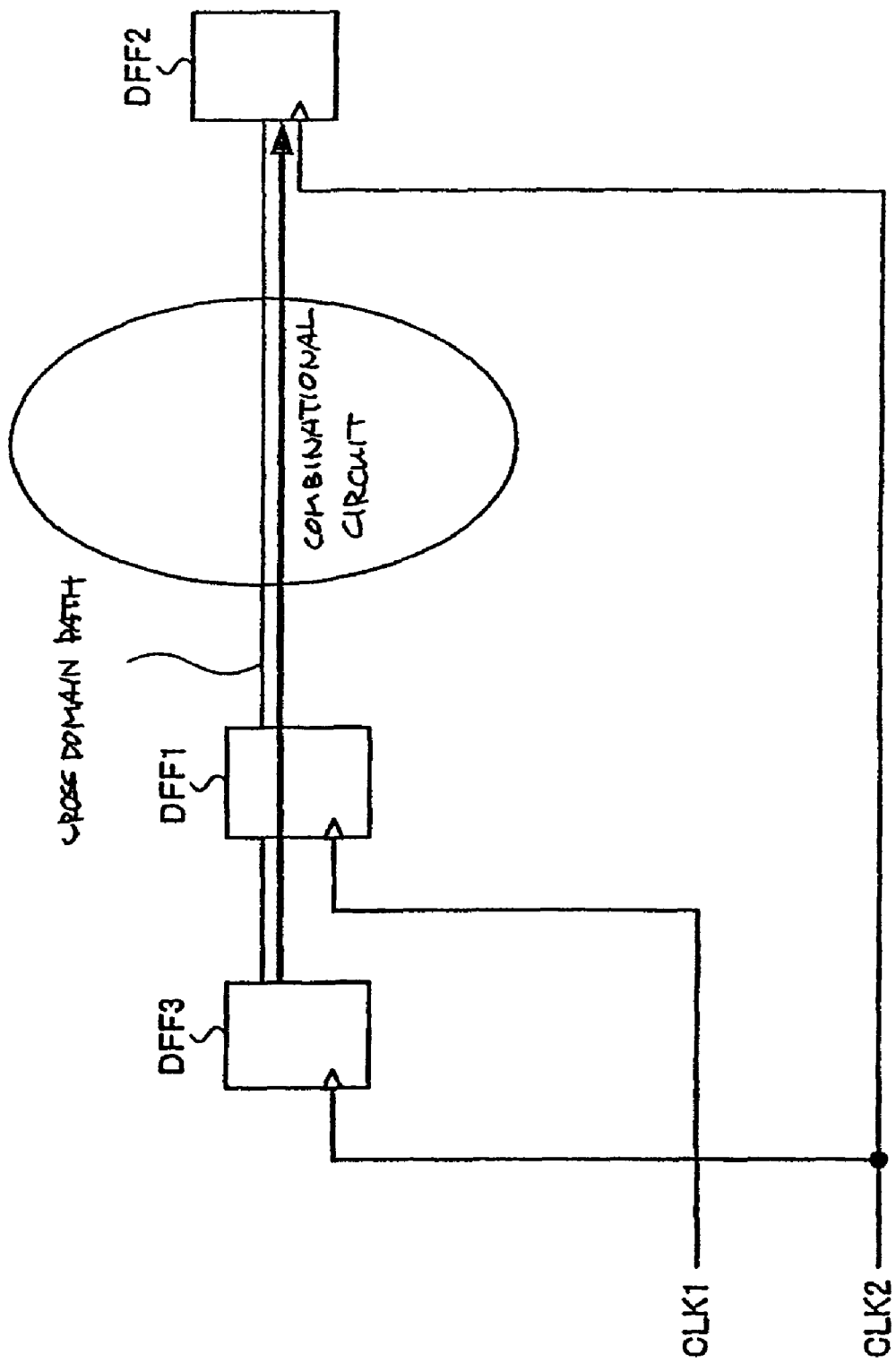
FIG. 1 is a circuit diagram explaining a concept of a test method according to an embodiment.

FIG. 1 is a circuit diagram explaining a concept of a test method according to the embodiment.

In FIG. 1, a DFF (flip-flop) 1 operates in accordance with a clock signal CLK 1, and DFFs 3 and 2 operate in accordance with a clock signal CLK 2. The clock CLK 1 and the clock CLK 2 are generated respectively by different phase locked loop (PLL) circuits. Moreover, the DFF 1 data output pin is connected to the DFF 2 data input pin via a combinational circuit.

As can be seen from FIG. 1, the DFF 1, a flip-flop of a CLK 1 domain is interposed between DFFs 3 and 2, both of which are flip-flops of a CLK 2 domain. Accordingly, a path from the DFF 3 to the DFF 2 is focused (the DFF 1 flushes), and release and capture operations are performed by use of the clock signal CLK 2 (a route shown with an arrow in FIG. 1).

In other words, a flip-flop driven by the same clock signal as that of a capture flip-flop is disposed anterior to (on the upstream side) a release flip-flop of a cross domain path. From this flip-flop, test data is released.

Note that the DFF 3 is located in the vicinity of the DFF 1 in FIG. 1 and may be arbitrarily chosen from user latches (flip-flops used in function) driven by using the clock signal CLK 2. Furthermore, when such an appropriate user latch is not found, a DFF 3 dedicated to the test may specially be provided.

Figure 2:
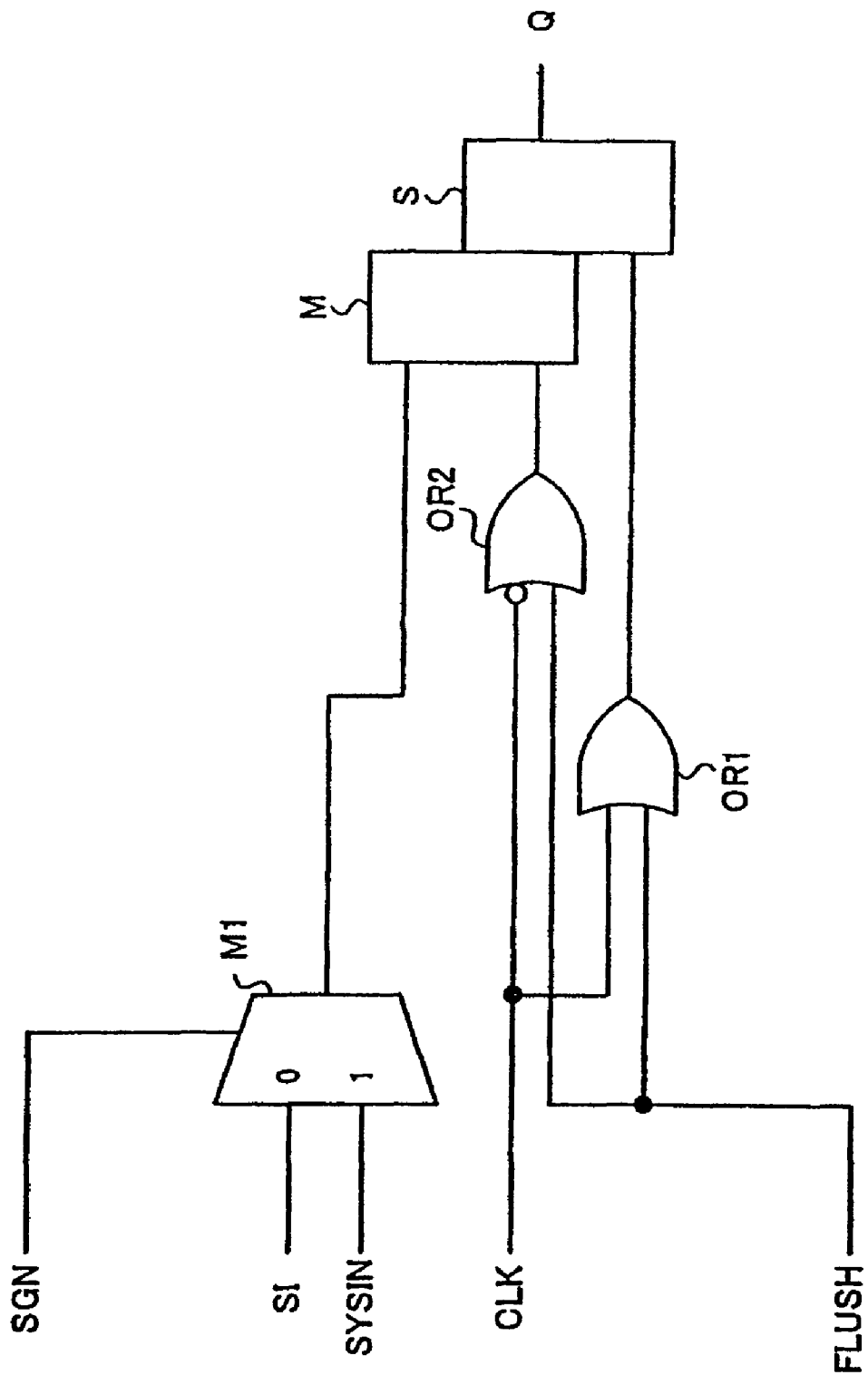
FIG. 2 is a view showing a configuration of a flip-flop used for a test in this embodiment.

FIG. 2 is a view showing a configuration of a MUXSCAN flip-flop used for the test in the embodiment.

In FIG. 2, when FLUSH is equal to 1, the outputs of both OR circuits OR 1 and OR 2 become "1". Thereby, two latches M and S become in a flush state. In this state, when SGN is set at 0 in a multiplexer M1, data is flushed from SI to Q in the circuit shown in FIG. 2.

Incidentally, the flip-flop in the drawing is a mere example of a configuration of a MUXSCAN flip-flop having a flush mode. In this embodiment, it is essential that flip-flops located at both ends of a cross domain path have a flush mode (or a through mode) from data input to data output, but the configuration is not limited to the one shown in FIG. 2. It does not matter, for example, to use an LSSD for the test in this embodiment, instead of MUXSCAN flip-flop shown in FIG. 2, since an LSSD latch used for an LSSD test can originally perform flush operation.

Figure 3:
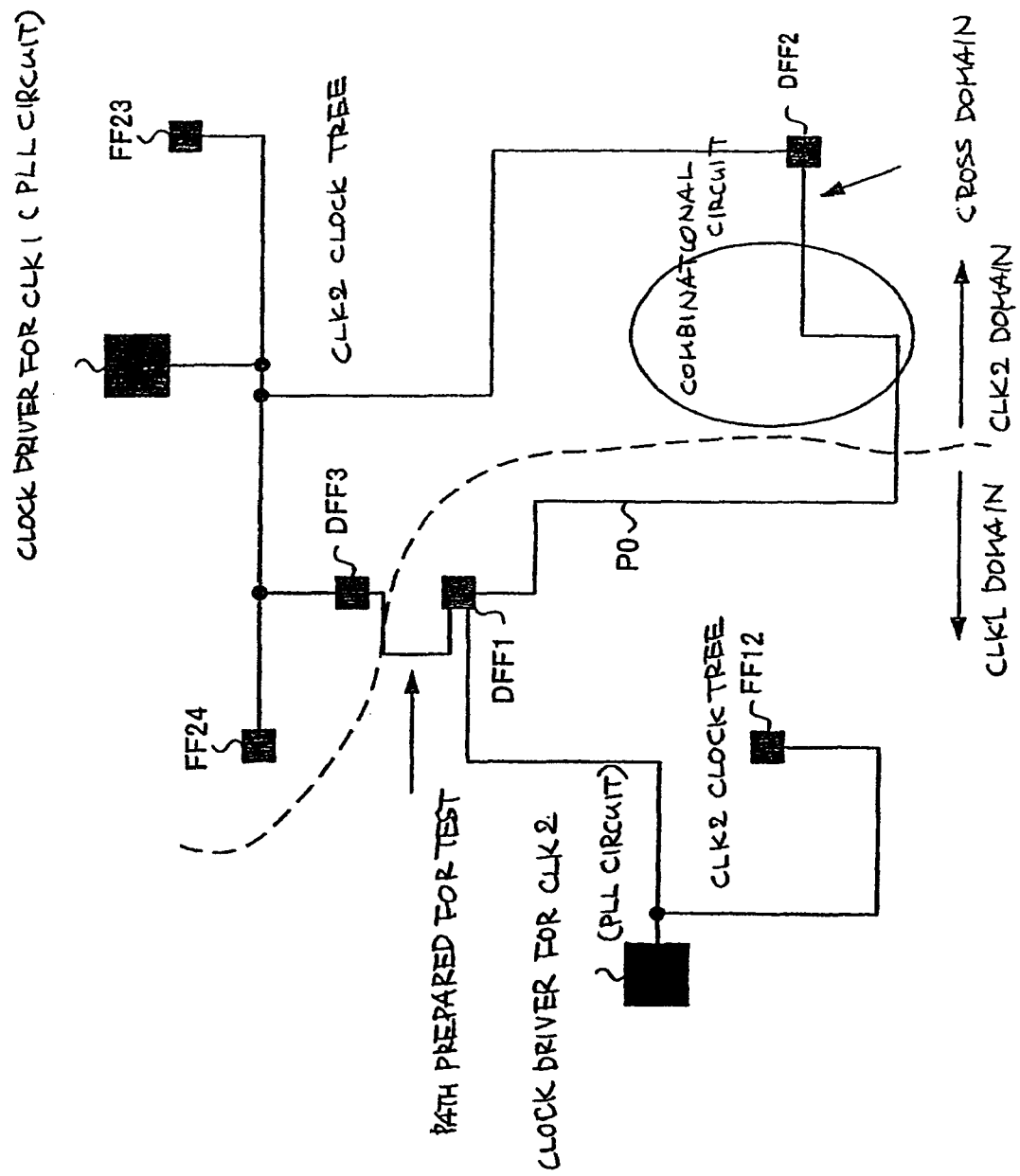
FIG. 3 is a view showing an image of a positional relationship of the circuits shown in FIG. 1 on an ASIC chip.

FIG. 3 is a view showing an image of a positional relationship of the circuits, shown in FIG. 1, on an ASIC chip.

Clock trees of the CLK 1 domain and the CLK 2 domain are shown in FIG. 3. A path PO connecting the DFF 1 of the CLK 1 domain to the DFF 2 of the CLK 2 domain is a target path under the test. Here, it can be seen that the DFF 3 of the CLK 2 domain is located in the vicinity of the DFF 1. In such a circuit configuration, an at-speed test on the path PO is carried out by releasing test data from the DFF 3 and by capturing it in the DFF 2.

Figure 4:
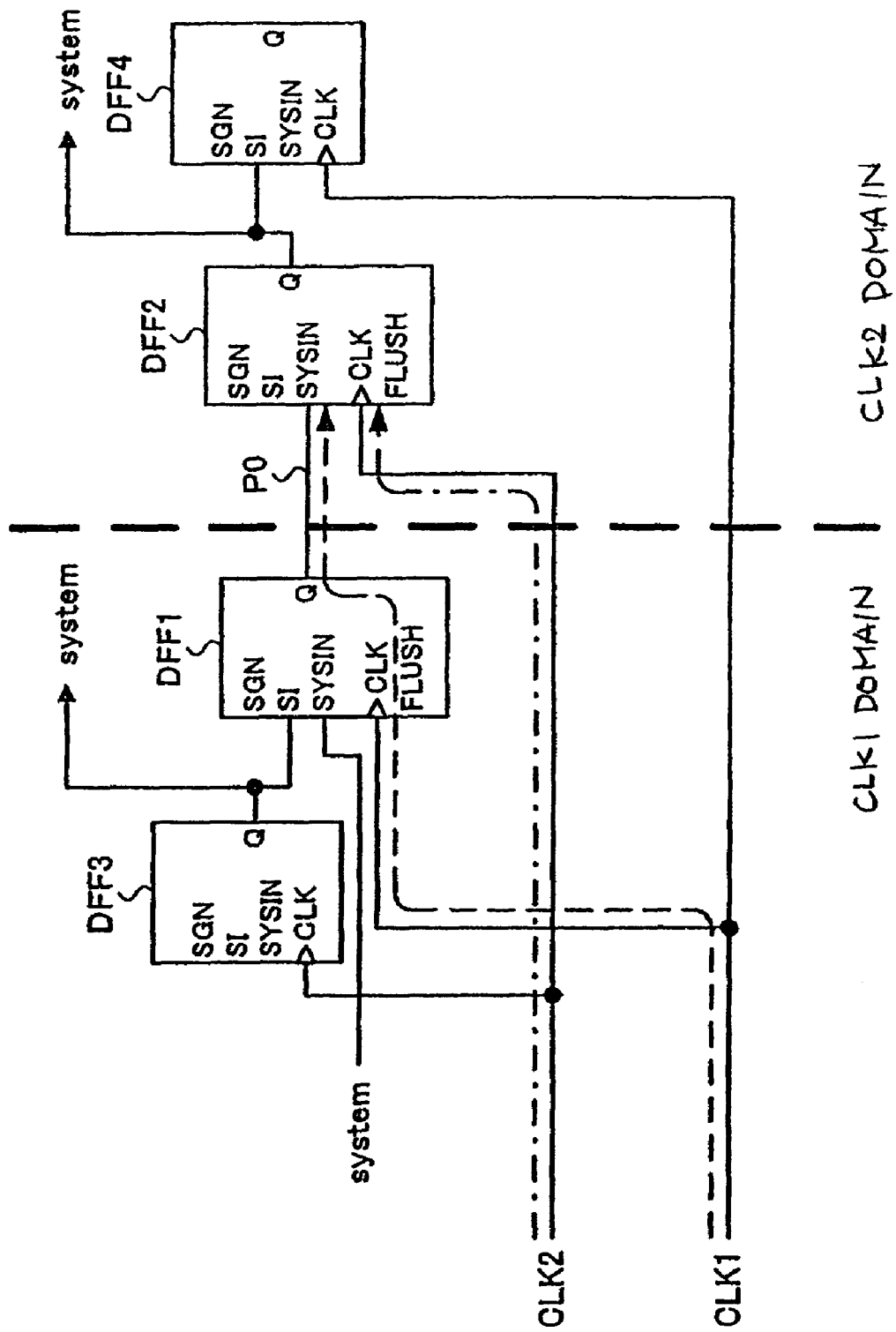
FIG. 4 is a view showing an example of a circuit configuration to realize the test according to this embodiment.

FIG. 4 is a view showing an example of a circuit configuration to realize the test according to this embodiment.

In FIG. 4, the DFFs 1 and 4 are flip-flops driven by using the clock signal CLK 1. Here, the DFFs 2 and 3 are flip-flops driven by using the clock signal CLK 2. Furthermore, the path PO between the DFFs 1 and 2 is a target path. The DFF 3 is a circuit of the CLK 2 domain, which is driven by using the CLK 2, as described above. The DFF 3, however, is illustrated on the CLK 1 domain side for convenience of explanation of the test method of this embodiment.

In the circuit diagrams shown in FIGS. 1 and 3, only the flip-flop DFF 3 for the test is illustrated on the upstream side of the DFF 1 in order to explain the concept of the test. With this configuration, however, an at-speed test on the target path by use of only the CLK 2 can be carried out. In reality, a configuration to carry out a test by use of the CLK 1 is also required. Accordingly, in the configuration shown in FIG. 4, a flip-flop DFF 4, which is similar to DFF 3, for the test is disposed on the downstream side of the DFF 2. This DFF 4 is a circuit of the CLK 1 domain, which is driven by using the CLK 1, as described above. The DFF 4, however, is illustrated on the CLK 2 domain side for convenience of explanation of the test method of this embodiment.

With reference to FIG. 4, in addition, Q output of the DFF 3 is connected to SI of the DFF 1 on the CLK 1 domain side. Moreover, Q output of the DFF 2 is connected to SI of the DFF 4 on the CLK 2 domain side. Then, Q output of the DFF 1 is connected to SYSIN of the DFF 2 with the path PO over the boundary between the CLK 1 domain and the CLK 2 domain.

As described above, the path PO shown in FIG. 4 is a test target in this embodiment. In reality, however, it is necessary to consider the test target including clock lines. The clock lines are configured of a signal propagation path shown with a broken line and a signal propagation path shown with an alternate long and short dashed line in the drawing. In other words, in consideration of signal propagation in the path PO, the following operation is performed. The pulse (clock signal) CLK 1 travels along the path shown with the broken line, and reaches a CLK pin of the DFF 1. In response to this, data is launched from Q of the DFF 1, and reaches SYSIN of the DFF 2 by propagating along the path PO. On the other hand, the pulse (clock signal) CLK 2 travels along the path shown with the alternate long and short dashed line, and reaches CLK of the DFF 2. In response to this, the DFF 2 latches the data which has arrived at SYSIN.

Taking the above into account, carrying out the at-speed test on the path between the DFFs 1 and 2 means none other than testing the following four points.

(A) The DFF 1 captures data at speed.
(B) The DFF 1 releases data at speed.
(C) The DFF 2 captures data at speed.
(D) The DFF 2 releases data at speed.

Since it is impossible to carry out the above-mentioned four tests at the same time, the tests are carried out by being divided into a plurality of modes. Here, the tests (A) and (D) are carried out at speed in the at-speed test within the CLK 1 domain and within the CLK 2 domain, respectively. Therefore, descriptions will hereinafter be given of the tests (B) and (C) in turn.

(First Test Mode)

In a first test mode, the capture of data in the DFF 2 is tested.

Figure 5:
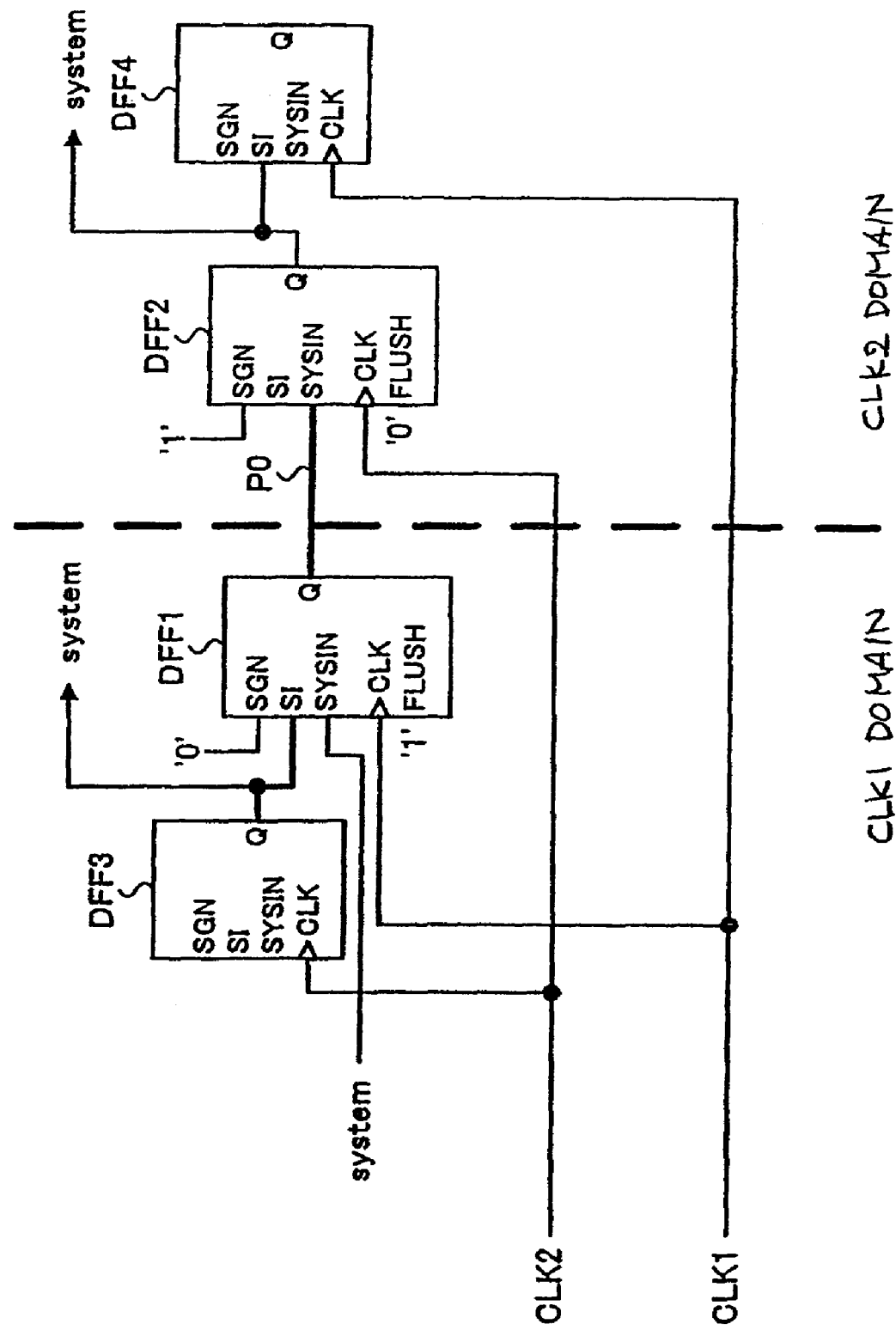
FIG. 5 is a view explaining a first test mode in the circuit configuration shown in FIG. 4.

FIG. 5 is a view explaining the first test mode in a circuit diagram shown in FIG. 4.

In FIG. 5, FLUSH is equal to 1 in the DFF 1 and FLUSH is equal to 0 in the DFF 2. Therefore, the DFF 1 flushes inputted data, while the DFF 2 captures the inputted data without flushing.

In this mode, test data is firstly set in the DFF 3. Then, the test data in the DFF 3 is released on receipt of the CLK 2 inputted to the DFF 3. At this time, since the DFF 1 flushes the test data from SI to Q, the test data propagates to the path PO as it is. Then, the DFF 2 captures the test data on receipt of the CLK 2 inputted to the DFF 2.

With the above procedures, the capture of the data by the DFF 2 is tested at speed (the CLK 2). In other words, the above-mentioned test (C) is carried out. Incidentally, a frequency figured out from a speed which a system designer assumes may be used for a frequency upon test in this mode.

(Second Test Mode)

In a second test mode, the release of data in the DFF 1 is tested.

Figure 6:
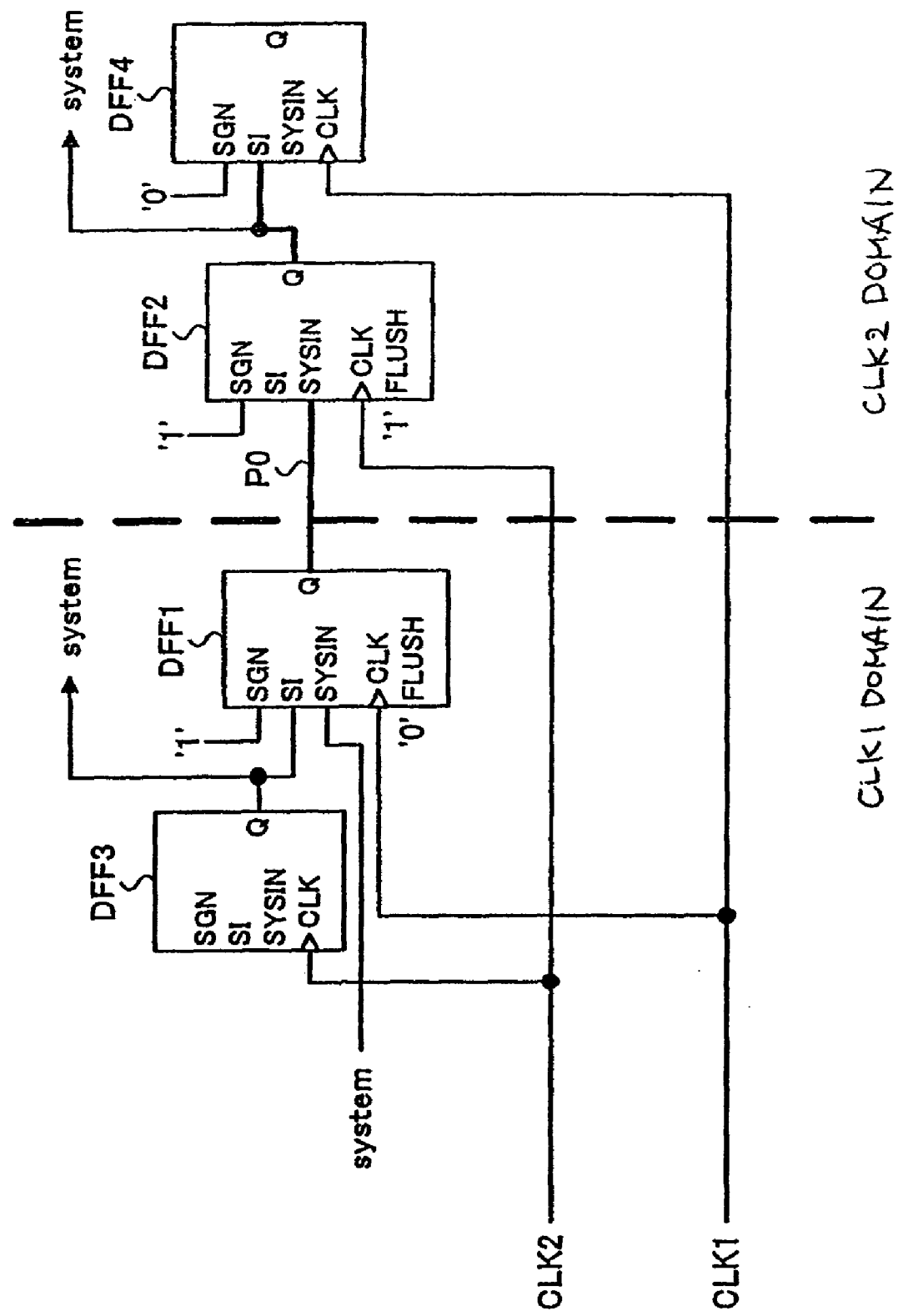
FIG. 6 is a view explaining a second test mode in the circuit configuration shown in FIG. 4.
Figure 7:
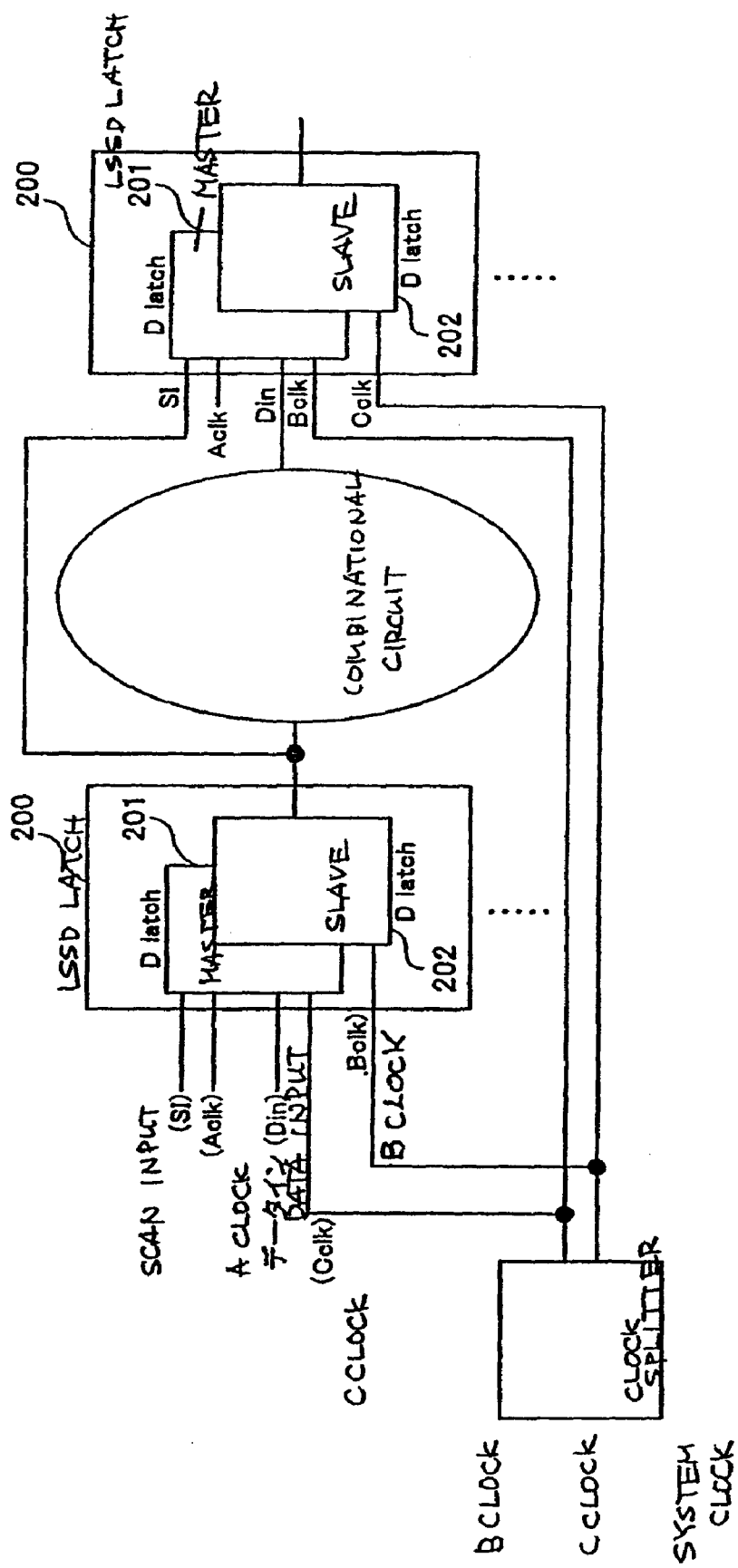
FIG. 7 is a schematic diagram showing a circuit configuration known in the prior art to carry out an LSSD test.

FIG. 6 is a view explaining the second test mode in the circuit configuration shown in FIG. 4.

In FIG. 6, FLUSH is equal to 0 in the DFF 1 and FLUSH is equal to 1 in the DFF 2. Hence, the DFF 1 holds inputted data without flushing, the DFF 2 flushes the inputted data.

In this mode, test data is firstly set in the DFF 1. Then, the test data in the DFF 1 is released on receipt of the CLK 1 inputted to the DFF 1. At this moment, the DFF 2 flushes the test data from SYSIN to Q. Then, the DFF 4 captures the test data on receipt of the CLK 1 inputted to the DFF 4.

With the above procedures, the release of the data by the DFF 1 is tested at speed (the CLK 1). In other words, the above-mentioned test (B) is carried out. Incidentally, a frequency figured out from a speed which a system designer assumes may be used for a frequency upon test in this mode, as in the case of the first test mode.

Moreover, as described above, the flip-flop DFF 4 for the test is used in the second test mode. This DFF 4 is disposed in a vicinity of the DFF 2 as the DFF 3 (the DFF 3 shown in FIG. 1). In addition, a user latch (a flip-flop used in function) driven by using the clock signal CLK 1 can be used as the DFF 4. When such an appropriate user latch does not exist, a DFF 4 dedicated to the test may specially be provided.

With the first and second test modes described above, the at-speed test targeted for a cross domain path is realized.

Note that the descriptions were given of the above-mentioned circuit configuration and test method on the precondition of a skewed load test. However, it is possible to apply the circuit configuration and test method to a broad side band test.

Figure 8:
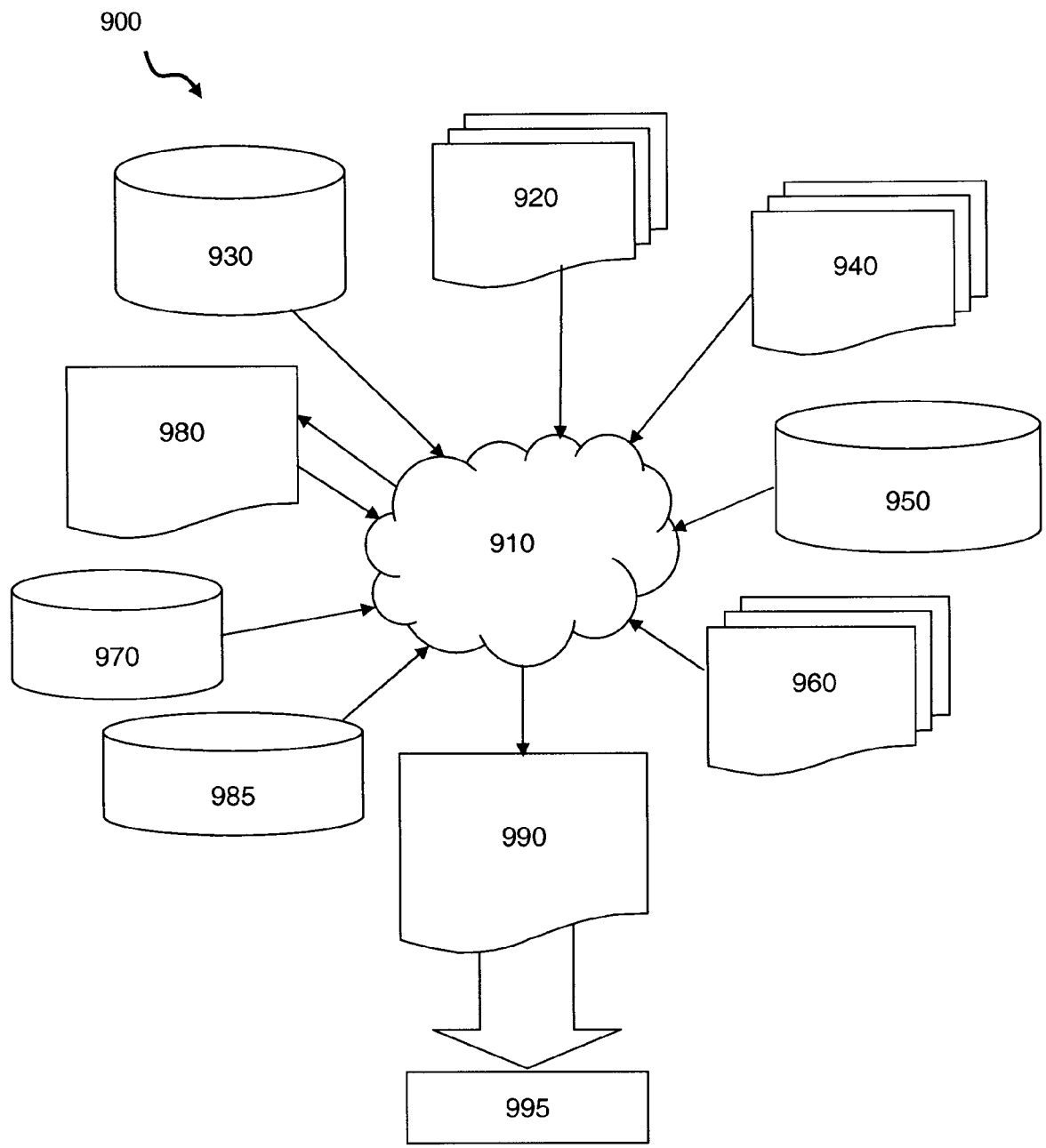
FIG. 8 is a flow diagram of a design process used in semiconductor design, manufacturing, and test activities.

With reference now to FIG. 8, there is shown a block diagram of an example design flow 900. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises circuit 100 in the form of schematics or HDL, a hardware-description language (e.g., Verilog, VHDL, C, etc.). Design structure 920 may be contained on one or more machine readable medium. For example, design structure 920 may be a text file or a graphical representation of circuit 100. Design process 910 preferably synthesizes (or translates) circuit 100 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1-6, along with any additional integrated circuit design or data (if applicable), into a second design structure 990. Design structure 990 resides on a storage medium in a data format used for the exchange of layout data of integrated circuits (e.g. information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

According to the present invention configured as above, it is possible to carry out an at-speed test on a cross domain path, that is, a test on the release and capture operation of data at speed.

Although the preferred embodiment of the present invention has been described in detail, it should be understood that various changes, substitutions and alternations can be made therein without departing from spirit of the inventions as defined by the appended claims.

What is claimed is:

1. A design structure for designing, manufacturing, or testing a design, the design structure comprising a Large Scale integrated (LSI) circuit chip including:

a first flip-flop which is capable of flushing test data, and which operates by using a first clock signal;
a second flip-flop which is capable of flushing said test data, and which operates by using a second clock signal, and which is connected to the first flip flop;
a third flip-flop which operates by using the second clock signal, and which is connected to the first flip-flop; and
a fourth flip-flop which operates by using the first clock signal, and which is connected to the second flip-flop,
the integrated circuit chip, wherein a test is performed in a computer on a path linking the first and the second flip-flops and is carried out in:
a first test mode in which said test data is released from the third flip-flop on receipt of the second clock signal, is flushed by the first flip-flop, and is captured in the second flip-flop; and
a second test mode in which said test data is released from the first flip-flop on receipt of the first clock signal, is flushed by the second flip-flop, and is captured in the fourth flip-flop.

2. The design structure of claim 1, wherein the design is represented by a netlist stored in said computer, which describes the LSI integrated circuit chip.

3. The design structure of claim 1, wherein the netlist representation resides in a storage medium.

4. The design structure of claim 1, wherein the design includes at least one of test data files, characterization data, verification data, or design specification.

5. A design structure for performing in a computer a test of an LSI integrated circuit chip which includes: a first flip-flop which is capable of flushing, and which operates by using a first clock signal; a second flip-flop capable of flushing, which operates by using a second clock signal, and which is connected to the first flip flop; a third flip-flop which operates by using the second clock signal, and which is connected to the first flip-flop; and a fourth flip-flop which operates by using the first clock signal, and which is connected to the second flip-flop, the design structure comprising:

means for releasing test data using a computer from the third flip-flop on receipt of the second clock signal, flushing the test data in the first flip-flop, and capturing the test data in the second flip-flop; and
means for releasing test data using a computer from the first flip-flop on receipt of the first clock signal, flushing the test data in the second flip-flop, and capturing the test data in the fourth flip-flop.

6. The design structure of claim 1, wherein the LSI integrated circuit chip is an ASIC.

7. The design structure of claim 6, wherein said ASIC is configured as a Level-Sensitive Scan Design (LSSD).

8. The design structure of claim 1, wherein said test is based on a pulse outputted from a clock generating circuit in said LSI chip, transmitting a clock signal and generating a release clock having intervals corresponding to an internal frequency of said LSI chip.

9. The design structure of claim 8, wherein said test is performed on a path within a domain, wherein release and capture of clock signals along said path are generated by a single clock generating circuit, said release and capture being performed without gating a clock line.

10. The design structure of claim 8 wherein a flip-flop is driven by the same clock signal as that of the signal of a capturing flip-flop positioned upstream a release clock of a cross domain path, thereby releasing said test data.

* * * * *